United States Patent [19]
Hong et al.

[11] Patent Number: 5,308,787
[45] Date of Patent: May 3, 1994

[54] UNIFORM FIELD OXIDATION FOR LOCOS ISOLATION

[75] Inventors: Gary Hong; Cheng H. Huang, both of Hsin-chu; Hong-Tsz Pan, Chang-hua City, all of Taiwan

[73] Assignee: United Microelectronics Corporation, Hsinchu, Taiwan

[21] Appl. No.: 139,860

[22] Filed: Oct. 22, 1993

[51] Int. Cl.⁵ .......................................... H01L 21/76
[52] U.S. Cl. ........................................ 437/70; 437/69;
   437/24; 437/25; 437/28; 437/61
[58] Field of Search .................... 437/69, 70, 72, 73,
   437/61, 24, 28, 25

[56] References Cited

U.S. PATENT DOCUMENTS

| | | | |
|---|---|---|---|
| 4,420,872 | 12/1983 | Solo de Zaldivar | 437/27 |
| 4,743,563 | 5/1988 | Pfiester et al. | 437/70 |
| 4,748,134 | 5/1988 | Holland et al. | 437/69 |
| 5,061,654 | 10/1991 | Shimizu et al. | 437/70 |
| 5,128,274 | 7/1992 | Yabu et al. | 437/70 |
| 5,137,843 | 8/1992 | Kim et al. | 437/70 |
| 5,173,438 | 12/1992 | Sandhu | 437/63 |

OTHER PUBLICATIONS

Josquin, "The Application of Nitrogen ion Implantation in Silicon Technology"; Nuclear Instruments and Methods 209/210 (1983); pp. 581–587, North-Holland Publishing Company.

VLSI Technology, International Edition, by S. M. Sze, McGraw-Hill Book Company, N.Y., N.Y. c. 1988 by McGraw-Hill Book Co., pp. 473-474.

"A Self Aligned Nitrogen Implantation Process (SNIP) to Minimize Field Oxide Thinning Effect in Submicrometer LOCOS", by Samnuk Ratanaphanyrat Jente B. Kuang, & S. Simon Wong, IEEE Transactions on Electron Devices, vol. 37, No. 9, Sep. 1990, pp. 1948-1958.

Primary Examiner—Brian E. Hearn
Assistant Examiner—Trung Dang
Attorney, Agent, or Firm—George O. Saile

[57] ABSTRACT

A new method of local oxidation using a nitrogen implant through a spin-on-glass film is described. A thin silicon oxide layer is formed over the surface of a silicon substrate. A layer of silicon nitride is deposited overlying the silicon oxide layer. The silicon oxide and silicon nitride layers are patterned to provide openings of various sizes exposing portions of the silicon substrate to be oxidized. Ions are selectively implanted into the silicon substrate through the openings. The patterned surface of the substrate is covered with a spin-on-glass material. The spin-on-glass material is thicker within the smaller openings and thinner within the larger openings. The spin-on-glass material is soft-baked. Nitrogen ions are selectively implanted into the silicon substrate through the spin-on-glass material within the openings wherein fewer nitrogen ions are implanted through the thicker spin-on-glass material within the smaller openings and more nitrogen ions are implanted through the thinner spin-on-glass material within the larger openings. The spin-on-glass material is removed. Field oxide regions are grown within the openings wherein the rate of field oxidation is inhibited most within the openings through which a larger concentration of nitrogen ions were implanted and inhibited to a lesser extent in openings through which smaller concentrations of nitrogen ions were implanted resulting in nearly equal thicknesses of field oxide regions in all openings of various sizes.

20 Claims, 2 Drawing Sheets

UNIFORM FIELD OXIDATION FOR LOCOS ISOLATION

BACKGROUND OF THE INVENTION

(1) Field of the Invention

This invention relates to the fabrication of integrated circuit devices and more particularly to a method of uniform local oxidation using a nitrogen implant in the fabrication of integrated circuits.

(2) Description of the Prior Art

Local oxidation of silicon (LOCOS) is the conventional lateral isolation scheme. The conventional local oxidation process is described in *VLSI Technology*, International Edition, by S. M. Sze, McGraw-Hill Book Company, N.Y., N.Y., c. 1988 by McGraw-Hill Book Co., pp. 473-474. A layer of silicon nitride is deposited over a pad oxide overlying a silicon substrate. The pad oxide is a thin thermal oxide which allows better adhesion between the nitride and silicon and acts as a stress relaxation layer during field oxidation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

However, as the silicon nitride opening between active device regions is reduced to the submicrometer regime, a reduction in field oxide thickness within the opening has been observed. This oxide thinning in the area where field spacing is narrow/small has caused insufficient isolation between active regions.

U.S. Pat. No. 5,061,654 to Shimizu et al and U.S. Pat. No. 5,128,274 to Yabu et al describe methods for purposefully making field oxide regions to be of different thicknesses. U.S. Pat. No. 5,173,438 to Sandhu shows a method for adjusting ion implantation to achieve different field oxide thicknesses. The purpose of the present invention is to achieve the same field oxide thicknesses for different sized openings.

In their article, "A Self-Aligned Nitrogen Implantation Process (SNIP) to Minimize Field Oxide Thinning Effect in Submicrometer LOCOS," by Somnuk Ratanaphanyarat, Jente B. Kuang, and S. Simon Wong, *IEEE Transactions on Electron Devices*, Vol. 37, No. 9, September 1990, pp. 1948-1958, the authors describe a method of implanting nitrogen into wide openings to slow field oxidation rates there. Nitrogen is not implanted into narrow openings which are shielded by oxide spacers so that field oxidation is not slowed in these regions.

The spin-on-glass materials have been used for planarization of integrated circuits. The material to be applied is thoroughly mixed in a suitable solvent. The spin-on-glass material suspended in the vehicle or solvent is deposited onto the semiconductor wafer surface and uniformly spread thereover by the action of spinning the wafer. The material fills the indentations in the integrated circuit wafer surface; that is planarization. Most of the vehicle or solvent is driven off by a low temperature baking step often followed by vacuum degassing. Other coatings of the spin-on-glass material are applied, baked and vacuum degassed until the desired spin-on glass layer is formed. The final step in the making of the spin-on-glass layer is curing. Curing is a high temperature heating step to cause the breakdown of the silicate or siloxane material to a silicon dioxide like cross linked material.

SUMMARY OF THE INVENTION

A principal object of the invention is to provide an effective and very manufacturable method to locally oxidize the silicon in an integrated circuit.

Another object of the present invention is to provide a method of local oxidation of silicon that will provide nearly the same field oxide thicknesses in the different sized nitride openings.

Yet another object is to provide a method of local oxidation which can be used in the fabrication of ULSI active isolation.

In accordance with the objects of this invention, a new method of local oxidation using a nitrogen implant through a spin-on-glass film is achieved. A thin silicon oxide layer is formed over the surface of a silicon substrate. A layer of silicon nitride is deposited overlying the silicon oxide layer. The silicon oxide and silicon nitride layers are patterned to provide openings of various sizes exposing portions of the silicon substrate to be oxidized. Ions are selectively implanted into said silicon substrate through the openings. The patterned surface of the substrate is covered with a spin-on-glass material. The spin-on-glass material is thicker within the smaller openings and thinner within the larger openings. The spin-on-glass material is soft-baked. Nitrogen ions are selectively implanted into the silicon substrate through the spin-on-glass material within the openings wherein fewer nitrogen ions are implanted through the thicker spin-on-glass material within the smaller openings and more nitrogen ions are implanted through the thinner spin-on-glass material within the larger openings. The spin-on-glass material is removed. Field oxide regions are grown within the openings wherein the rate of field oxidation is inhibited most within the openings through which a larger concentration of nitrogen ions were implanted and inhibited to a lesser extent in openings through which smaller concentrations of nitrogen ions were implanted resulting in nearly equal thicknesses of field oxide regions in all openings of various sizes.

BRIEF DESCRIPTION OF THE DRAWINGS

In the accompanying drawings forming a material part of this description, there is shown.

DESCRIPTION OF THE PREFERRED EMBODIMENTS

Figure 1:
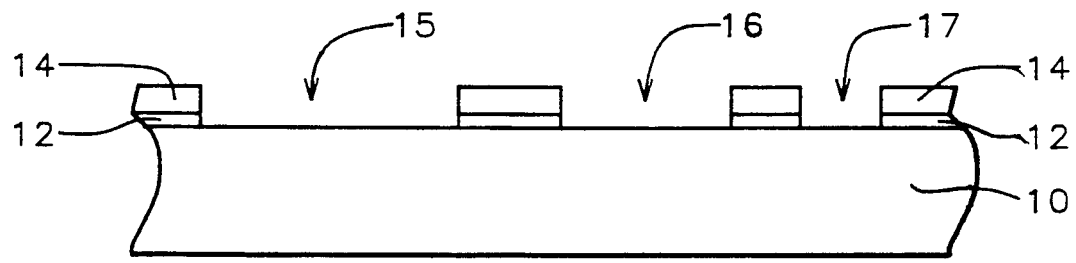
FIGS. 1 through 4 schematically illustrate in cross-sectional representation one preferred embodiment of the present invention.

Referring now more particularly to FIG. 1, there is shown a monocrystalline silicon substrate 10. A layer 12 of pad silicon oxide is thermally grown on the surface of the substrate to a preferred thickness of between about 100 to 300 Angstroms. A layer of silicon nitride 14 is deposited over the pad oxide layer by chemical vapor deposition (CVD) to a thickness of between about 500 to 2500 Angstroms.

The silicon nitride and silicon oxide layers are patterned using conventional lithography and etching techniques, such as plasma dry etching to provide openings 15, 16, and 17 to the silicon substrate 10 in the places where the isolation regions are to be formed. A channel-stop implantation (not shown) using, for example, boron ions at a dosage of between about 1 E 13 to 1 E 14 atoms/cm$^2$ and energy of 10 to 40 KeV is performed.

Figure 2:
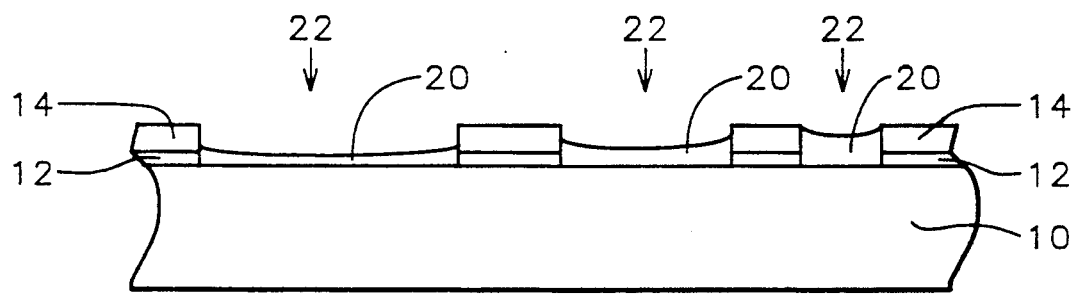

Referring now to FIG. 2, a spin-on-glass coating 20 is applied. The spin-on-glass material suspended in the vehicle or solvent is deposited onto the semiconductor wafer surface and uniformly spread thereover by the action of spinning the wafer. The material fills the openings 15, 16, and 17 in the integrated circuit wafer surface. The spin-on-glass layer is thicker in the smaller openings such as 17 and thinner in the larger openings such as 15. Most of the vehicle or solvent is driven off by a low temperature baking step of less than about 180° C. The thickness of the spin-on-glass layer is between about 500 to 2500 Angstroms as measured on a bare wafer.

Nitrogen ions 22 are implanted into the silicon substrate 10 through the openings 15, 16, and 17. The preferred dosage is between about 1 E 15 to 2 E 16 atoms/cm$^2$ at an energy of between about 20 to 80 KeV. The incorporation of nitrogen ions into the silicon substrate will inhibit the subsequent oxidation rate. Since the field areas with narrower spacing, 17, are covered with a thicker spin-on-glass film, fewer nitrogen ions reach the substrate. The narrower area will have a higher oxidation rate than will the wider area, 15. The higher oxidation rate is used to compensate for the field oxide thinning effect in the narrower areas. Careful adjustment of the spin-on-glass coating process in combination with the nitrogen implantation process can deliver a required oxidation inhibition effect of various extents so as to grow a uniform thickness field oxide across areas with different field spacings.

Figure 3:
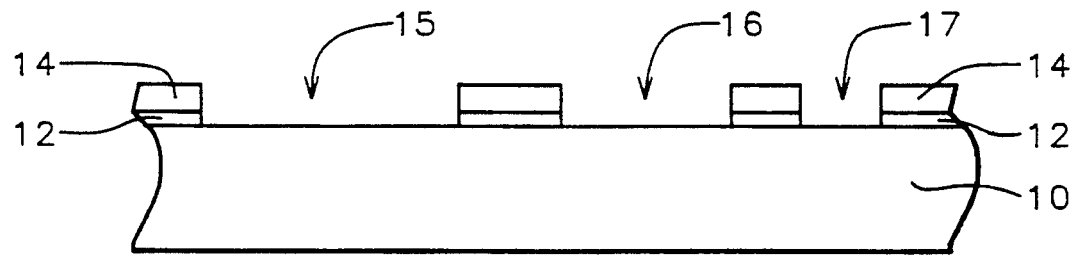

Referring now to FIG. 3, the spin-on-glass material is removed by buffered hydrofluoric acid (BHF) in the ratio H$_2$O:BHF of between about 10:1 to 100:1 for between about 30 seconds to 2 minutes.

Figure 4:
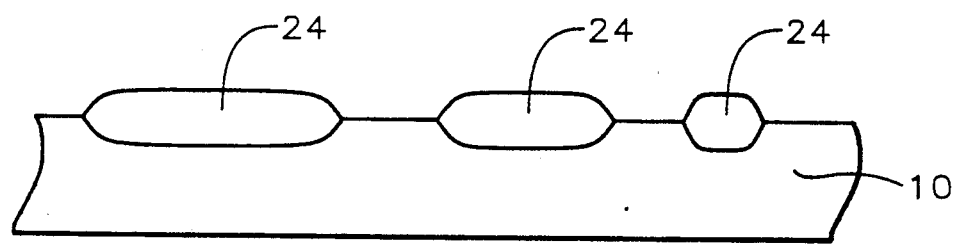

Field oxide is grown in the areas not protected by the silicon nitride layer 14. Field oxidation rates for each sized opening will be different, resulting in nearly equal thicknesses of the field oxide areas 24 of between about 3000 to 8000 Angstroms. The silicon nitride layer is stripped using phosphoric acid, a plasma stripper, or the like. The pad oxide layer 12 is removed by buffered hydrofluoric acid resulting in the final local oxidation structure illustrated in FIG. 4.

The process of the present invention results in field oxide thicknesses that are nearly equal for all sizes of openings, including the submicrometer openings required for ULSI manufacture.

Figure 5:
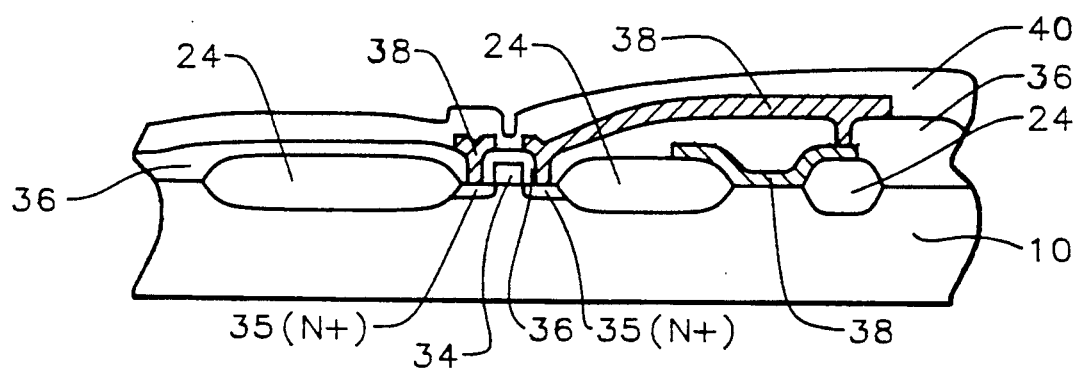
FIG. 5 schematically illustrates in cross-sectional representation a completed integrated circuit of the present invention.

The integrated circuit may be completed as is conventional in the art. For example, referring to FIG. 5, gate oxide layer 32 may be deposited followed by patterning to provide openings for buried contact regions. A threshold-adjust ion implant may be required at this point. Next, gate electrode 34 and source/drain regions 35 are fabricated. Dielectric layer 36, which may be borophosphosilicate glass (BPSG) is deposited. Contact openings are etched through the dielectric layer to expose the source/drain regions where contacts are desired. Metal layer 38, typically aluminum, is deposited and patterned to complete contacts to the source-/drain regions followed by the deposition of a top capping layer 40 of silicon nitride and/or an oxide to complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of local oxidation of an integrated circuit comprising:

forming a thin silicon oxide layer over the surface of a silicon substrate;

depositing a layer of silicon nitride overlying said silicon oxide layer;

patterning said silicon oxide and silicon nitride layers to provide openings of various sizes exposing portions of said silicon substrate that will be oxidized in a subsequent process;

selectively implanting channel-stop ions into said silicon substrate through said openings;

covering said patterned surface of said substrate with a spin-on-glass material wherein said spin-on-glass material is thicker within the smaller openings and thinner within the larger openings and baking said spin-on-glass material;

selectively implanting nitrogen ions into said silicon substrate through said spin-on-glass material within said openings wherein fewer nitrogen ions are implanted through said thicker spin-on-glass material within said smaller openings and more nitrogen ions are implanted through said thinner spin-on-glass material within said larger openings;

removing said spin-on-glass material;

growing field oxide regions within said openings wherein the rate of field oxidation is inhibited more within the openings through which a larger concentration of nitrogen ions were implanted; and removing said silicon nitride and said silicon oxide layers thereby completing local oxidation of said integrated circuit.

2. The method of claim 1 wherein said thin silicon oxide layer has a preferred thickness of between about 100 to 300 Angstroms.

3. The method of claim 1 wherein said silicon nitride layer has a preferred thickness of between about 500 to 2500 Angstroms.

4. The method of claim 1 wherein said channel-stop ion implantation is done with boron ions at a dosage of between about 1 E 13 to 1 E 14 atoms/cm$^2$ and an energy of between about 10 to 40 KeV.

5. The method of claim 1 wherein said spin-on-glass material has a thickness of between about 500 to 2500 Angstroms.

6. The method of claim 1 wherein said spin-on-glass material is baked at less than about 200° C. for 0.5 to 3 minutes.

7. The method of claim 1 wherein said nitrogen ion implantation is performed at a dosage of between about 1 E 15 to 2 E 16 atoms/cm$^2$ and energy of between about 20 to 80 KeV.

8. The method of claim 1 wherein said field oxide regions are grown to a thickness of between about 3000 to 8000 Angstroms.

9. The method of claim 1 wherein said field oxidation regions are nearly the same thickness for all said openings of various sizes.

10. The method of local oxidation of an integrated circuit comprising:

forming a thin silicon oxide layer over the surface of a silicon substrate;

depositing a layer of silicon nitride overlying said silicon oxide layer;

patterning said silicon oxide and silicon nitride layers to provide openings exposing portions of said silicon substrate that will be oxidized in a subsequent process;

selectively implanting channel-stop ions into said silicon substrate through said openings;

covering said patterned surface of said substrate with a spin-on-glass material and baking said spin-on-glass material;

selectively implanting nitrogen ions into said silicon substrate through said spin-on-glass material within said openings;

removing said spin-on-glass material;

growing field oxide regions within said openings; and removing said silicon nitride and said silicon oxide layers thereby completing local oxidation of said integrated circuit.

11. The method of claim 10 wherein said thin silicon oxide layer has a preferred thickness of between about 100 to 300 Angstroms.

12. The method of claim 10 wherein said silicon nitride layer has a preferred thickness of between about 500 to 2500 Angstroms.

13. The method of claim 10 wherein said channel-stop ion implantation is done with boron ions at a dosage of between about 1 E 13 to 1 E 14 atoms/cm$^2$ and an energy of between about 10 to 40 KeV.

14. The method of claim 10 wherein said spin-on-glass material has a thickness of between about 300 to 1000 Angstroms and wherein said spin-on-glass material is thicker within the smaller openings and thinner within the larger openings.

15. The method of claim 10 wherein said spin-on-glass material is baked at less than about 180° C. for 0.5 to 3 minutes.

16. The method of claim 10 wherein said nitrogen ion implantation is performed at a dosage of between about 1 E 15 to 2 E 16 atoms/cm$^2$ and energy of between about 20 to 80 KeV.

17. The method of claim 10 wherein said nitrogen implantation is performed through said spin-on-glass material within said openings and wherein a smaller amount of said nitrogen ions penetrate into said substrate under said smaller openings where there is a thicker coating of said spin-on-glass material than penetrate into said substrate under larger openings where there is a thinner coating of said spin-on-glass material.

18. The method of claim 17 wherein said field oxidation within said smaller openings will take place at a higher rate than within said larger openings because the higher concentration of said nitrogen ions within said larger openings inhibits said oxidation rate to a greater extent than does the lower concentration of said nitrogen ions within said smaller openings.

19. The method of claim 10 wherein said field oxide regions are grown to a thickness of between about 3000 to 8000 Angstroms.

20. The method of claim 10 wherein said field oxidation regions are nearly the same thickness for all said openings of various sizes.

* * * * *